(12) United States Patent  
Torazawa

(10) Patent No.: US 8,310,052 B2  
(45) Date of Patent: Nov. 13, 2012

(54) SEMICONDUCTOR DEVICE AND METHOD FOR MANUFACTURING SAME

(75) Inventor: Naoki Torazawa, Toyama (JP)

(73) Assignee: Panasonic Corporation, Osaka (JP)

( * ) Notice: Subject to any disclaimer, the term of this patent is extended or adjusted under 35 U.S.C. 154(b) by 43 days.

(21) Appl. No.: 12/950,450

(22) Filed: Nov. 19, 2010

(65) Prior Publication Data

US 2011/0062588 A1 Mar. 17, 2011

Related U.S. Application Data

(63) Continuation of application No. PCT/JP2009/004457, filed on Sep. 9, 2009.

(30) Foreign Application Priority Data

Dec. 24, 2008 (JP) ................................ 2008-328193

(51) Int. Cl.  
   *H01L 23/48* (2006.01)
(52) U.S. Cl. ................ 257/751; 438/627; 257/E21.584
(58) Field of Classification Search .......... 438/618–638; 257/E21.579, E21.584, E21.587  
See application file for complete search history.

(56) References Cited

U.S. PATENT DOCUMENTS

| | | |
|---|---|---|
| 2006/0251872 A1 | 11/2006 | Wang et al. |
| 2008/0023838 A1 | 1/2008 | Sakata et al. |
| 2008/0132050 A1* | 6/2008 | Lavoie ........................ 438/584 |
| 2008/0142971 A1* | 6/2008 | Dordi et al. .................. 257/751 |
| 2008/0206982 A1 | 8/2008 | Suzuki |
| 2009/0166867 A1* | 7/2009 | Simka et al. ................. 257/751 |

FOREIGN PATENT DOCUMENTS

| | | |
|---|---|---|
| JP | 2001-053077 A | 2/2001 |
| JP | 2005-203569 A | 7/2005 |
| JP | 2007-258390 | 10/2007 |

* cited by examiner

*Primary Examiner* — Brook Kebede  
(74) *Attorney, Agent, or Firm* — McDermott Will & Emery LLP

(57) ABSTRACT

A semiconductor device includes: a trench formed on an interlayer insulating film on a semiconductor substrate; a first barrier metal film formed to cover the bottom and sidewalls of the trench, the first barrier metal film being comprised of an electric conductor containing a platinum-group element, a refractory metal, and nitrogen; and a metal film formed on the first barrier metal film in the trench. The amount of nitrogen decreases in the thickness direction of the first barrier metal film toward the metal film.

17 Claims, 3 Drawing Sheets

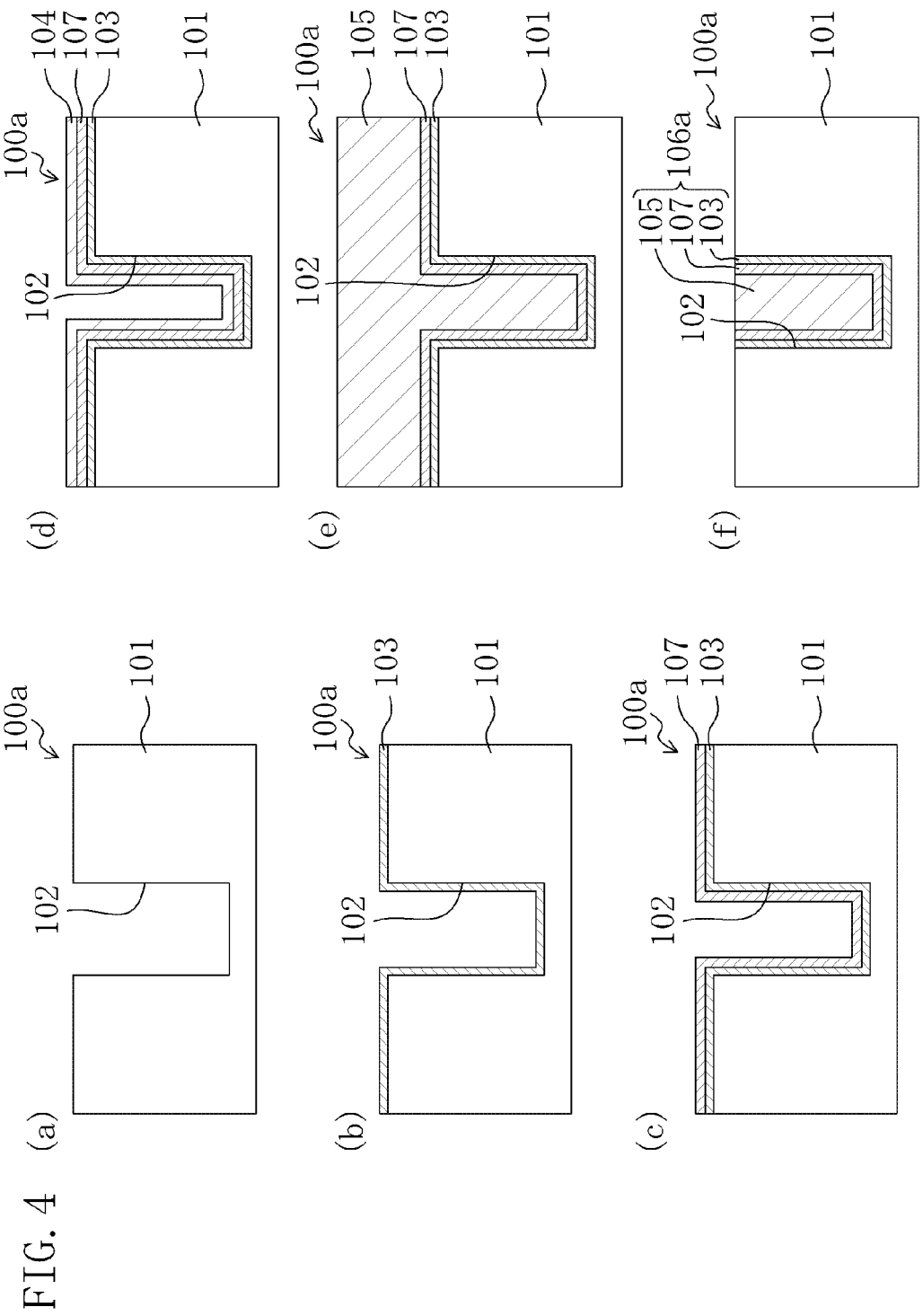

SEMICONDUCTOR DEVICE AND METHOD FOR MANUFACTURING SAME

CROSS-REFERENCE TO RELATED APPLICATION

This is a continuation of PCT International Application PCT/JP2009/004457 filed on Sep. 9, 2009, which claims priority to Japanese Patent Application No. 2008-328193 filed on Dec. 24, 2008. The disclosures of these applications including the specifications, the drawings, and the claims are hereby incorporated by reference in their entirety.

BACKGROUND

Since complementary metal oxide semiconductor (CMOS) devices of 0.13 μm rule were introduced, Cu interconnects have been used in system large scale integration (LSI) circuits for the purposes of reducing interconnect resistance, suppressing or reducing interconnect delay, and the like. With continued progress toward further miniaturization, however, the degree of difficulty in filling interconnects, via plugs, etc. tends to be increasing.

Currently, to improve the filling characteristics and the reliability, it has been proposed to use, as a barrier material, Ru that is good in wettability to Cu atoms compared with Ta conventionally used.

Use of Ru as a barrier metal material is described in Japanese Patent Publication No. 2007-258390, which proposes use of a Ru alloy (RuTa) as a diffusion preventing layer 15 of a semiconductor device.

SUMMARY

However, a Ru alloy (RuTa) cannot reduce diffusion of Cu sufficiently, and thus fails to exhibit both good wettability to Cu and barrier properties.

To address the above problem, a semiconductor device provided with a barrier film good in both the wettability to Cu and the barrier properties, as well as a method for manufacturing such a semiconductor device, will be discussed hereinafter.

The semiconductor device of the present disclosure includes: a trench formed on an interlayer insulating film on a semiconductor substrate; a first barrier metal film formed to cover a bottom and sidewalls of the trench, the first barrier metal film being comprised of an electric conductor containing a platinum-group element, a refractory metal, and nitrogen; and a metal film formed on the first barrier metal film in the trench.

In the semiconductor device of the present disclosure, the first barrier metal film exhibits both good wettability to Cu and barrier properties against Cu diffusion. As a result, in the semiconductor device, Cu filling of a fine pattern can be performed satisfactorily, and also Cu diffusion to the interlayer insulating film can be reduced.

The first barrier metal film may be of a single-layer structure.

Preferably, the amount of nitrogen decreases in the direction of the thickness of the first barrier metal film toward the metal film.

The electric conductor containing a platinum-group element, a refractory metal, and nitrogen is more excellent in wettability to Cu as the amount of nitrogen is smaller. Therefore, a reduced amount of nitrogen on the side closer to the metal film made of copper or a copper alloy is advantageous for improving the filling characteristics and the reliability.

Especially, it is preferable that nitrogen is no more contained in a portion in contact with the metal film as a result of gradual decrease of nitrogen amount.

Preferably, the semiconductor device further includes a second barrier metal film formed between the first barrier metal film and the metal film, the second barrier metal film being comprised of an electric conductor containing a platinum-group element and a refractory metal.

The above configuration is advantageous for improving the filling characteristics with the metal film made of copper or a copper alloy and the reliability. The reason is that, since the second barrier metal film does not contain nitrogen (or contains a smaller amount of nitrogen than the first barrier metal film), the wettability to Cu is excellent.

Preferably, the concentration of the refractory metal contained in the first barrier metal film is equal to or more than a solid solubility limit of the refractory metal in the platinum-group element.

By the above setting, the barrier properties of the first barrier metal film against Cu improve.

Preferably, the platinum-group element is at least one selected from the group consisting of ruthenium (Ru), rhodium (Rh), palladium (Pd), osmium (Os), iridium (Ir), and platinum (Pt). Also, preferably, the refractory metal is at least one selected from the group consisting of tantalum (Ta), titanium (Ti), tungsten (W), and vanadium (V).

Such elements can be listed as examples of platinum-group elements and refractory metals.

Preferably, the first barrier metal film contains a nitride of the refractory metal. This makes it possible to avoid desorption of nitrogen under heat treatment, etc., and thus further ensures exertion of the barrier properties against copper.

The method for manufacturing a semiconductor device of the present disclosure includes the steps of: (a) forming a trench on an interlayer insulating film on a semiconductor substrate; (b) forming a first barrier metal film to cover a bottom and sidewalls of the trench, the first barrier metal film being comprised of an electric conductor containing a platinum-group element, a refractory metal, and nitrogen; (c) depositing copper or a copper alloy to cover the first barrier metal film; (d) filling the trench with a copper film after the step (c); and (e) removing portions of the first barrier metal film and the copper film protruding from the trench to form an interconnect after the step (d).

According to the method for manufacturing a semiconductor device of the present disclosure, the first barrier metal film, comprised of an electric conductor containing a platinum-group element, a refractory element, and nitrogen, is excellent in both the wettability to copper and the copper barrier properties. Therefore, a semiconductor device exhibiting both of the above properties can be manufactured.

Preferably, the method further includes the step of (f) forming a second barrier metal film to cover the first barrier metal film, the second barrier metal film being comprised of an electric conductor containing a platinum-group element and a refractory metal, after the step (b) and before the step (c), wherein in the step (c), copper or a copper alloy is deposited to cover the second barrier metal film, and in the step (e), a portion of the second barrier metal film protruding from the trench is also removed.

The second barrier metal film, which contains a platinum-group element and a refractory element but does not contain nitrogen (or contains a smaller amount of nitrogen than the first barrier metal film), is more excellent in wettability to Cu than the first barrier metal film. Therefore, the formation of the second barrier metal film is advantageous in the filling characteristics and the reliability during deposition of copper or a copper alloy.

Preferably, in the step (b), the first barrier metal film is formed to have a single-layer structure.

Preferably, in the step (b), the first barrier metal film is formed so that an amount of nitrogen decreases in a direction toward the center of the trench.

A smaller amount of nitrogen contributes to more excellent wettability to Cu. Therefore, the nitrogen amount is reduced on the side of the first barrier metal film on which copper or a copper alloy is to be deposited in a later step, whereby the reliability can be improved.

Preferably, the concentration of the refractory metal contained in the first barrier metal film is equal to or more than a solid solubility limit of the refractory metal in the platinum-group element.

By the above setting, the barrier properties of the first barrier metal film against Cu improve.

Preferably, the platinum-group element is at least one selected from the group consisting of ruthenium (Ru), rhodium (Rh), palladium (Pd), osmium (Os), iridium (Ir), and platinum (Pt). Also, preferably, the refractory metal is at least one selected from the group consisting of tantalum (Ta), titanium (Ti), tungsten (W), and vanadium (V).

Such elements can be listed as examples of platinum-group elements and refractory metals.

As described above, according to the semiconductor device and a method for manufacturing the same of the present disclosure, a barrier film capable of exhibiting both good wettability to Cu and barrier properties against Cu diffusion is achieved. As a result, Cu filling of a fine pattern is performed satisfactorily, and Cu diffusion to the interlayer insulating film is reduced.

BRIEF DESCRIPTION OF THE DRAWINGS

FIGS. 4A-4F are cross-sectional views showing an example semiconductor device, and a step-by-step manufacturing process thereof, of the second embodiment of the present disclosure.

DETAILED DESCRIPTION

Figure 1:
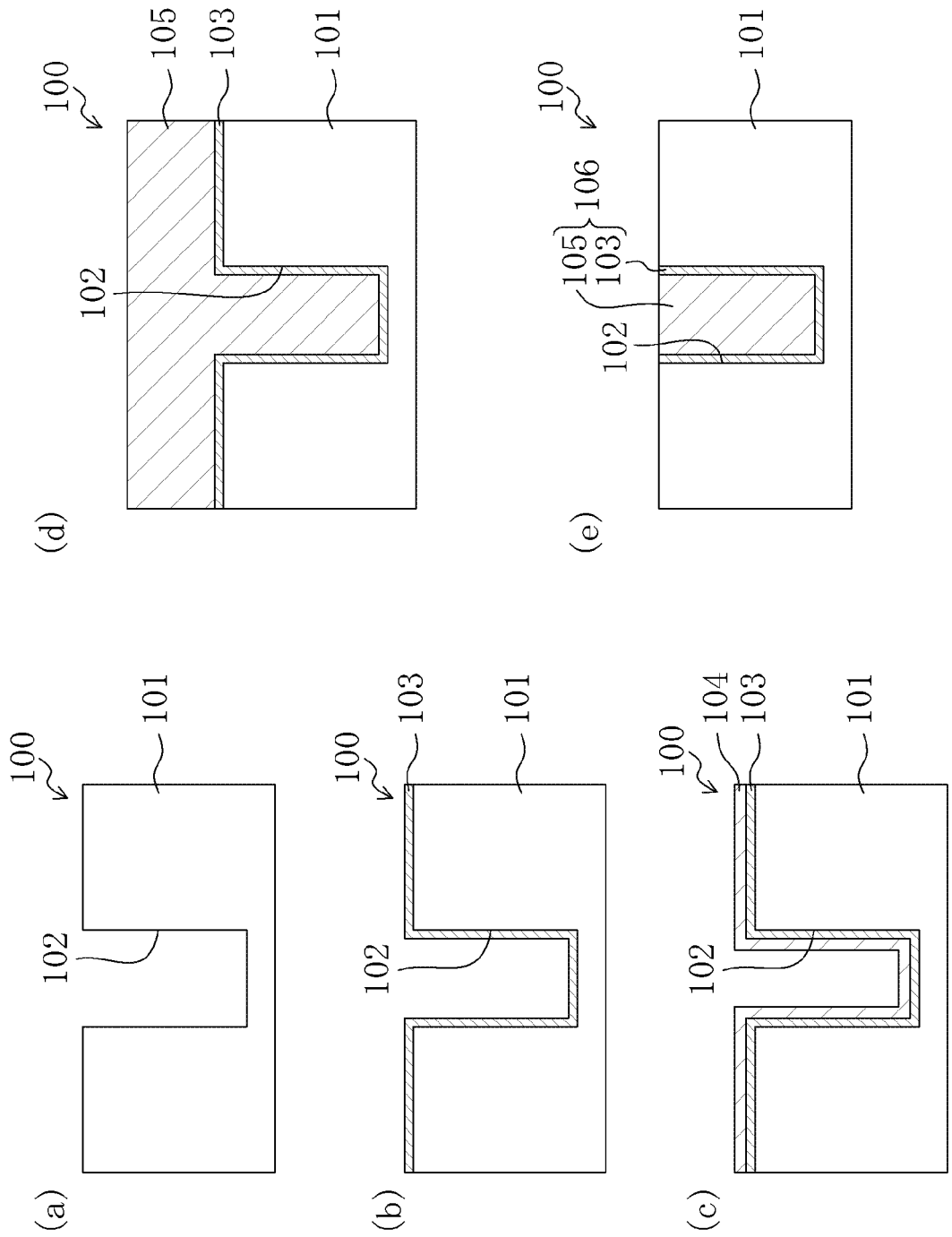
FIGS. 1A-1E are cross-sectional views showing an example semiconductor device, and a step-by-step manufacturing process thereof, of the first embodiment of the present disclosure.

Embodiments of the present disclosure will be described hereinafter with reference to the drawings. It should be noted that the same components are denoted by the same reference characters throughout the drawings and individual description of such components is sometimes omitted. It should also be noted that description of the embodiments to follow is merely illustrative and does not limit the scope of the invention.

(First Embodiment)

An example semiconductor device 100, and a method for manufacturing the semiconductor device, of the first embodiment will be described hereinafter. FIGS. 1A-1E are cross-sectional views illustrating a step-by-step manufacturing process of the semiconductor device 100.

First, a step shown in FIG. 1A is performed. An interlayer insulating film 101 made of a SiOC film is formed by chemical vapor deposition (CVD) on a semiconductor substrate (not shown) having elements such as transistors formed thereon.

Thereafter, a photoresist (not shown) having a trench pattern is formed on the interlayer insulating film 101 by photolithography. Dry etching is then performed using the photoresist as a mask, to remove a predetermined portion of the interlayer insulating film 101 thereby forming a trench 102. A fluorocarbon (CF) gas is used as the etching gas. After the dry etching, the trench-patterned photoresist is removed by ashing. The trench 102 may have a width of 45 nm and a depth of 90 nm, for example.

A step shown in FIG. 1B is then performed. A first barrier metal film 103 is formed by sputtering to cover the sidewalls and bottom of the trench 102. For this formation, a reactive sputtering method is preferably employed where a RuTa alloy target is used and nitrogen ($N_2$) gas is introduced.

The conditions for the above film formation by sputtering are as follows: target power 10000 W, substrate bias power 500 W, DC-coil power 0 W, RF-coil power 2000 W, Ar flow 15 sccm, and $N_2$ flow 35 sccm. The sccm refers to mL/minute in the standard state (0° C., 1013 hPa).

The thus-formed first barrier metal film 103 in this embodiment is a single-layer RuTaN film.

The Ta concentration of the alloy target will be described. A RuTa film and a RuTaN film were formed using a RuTa target having a Ta concentration of 10 wt. % to evaluate the film properties. The evaluation results are as follows.

Figure 2:
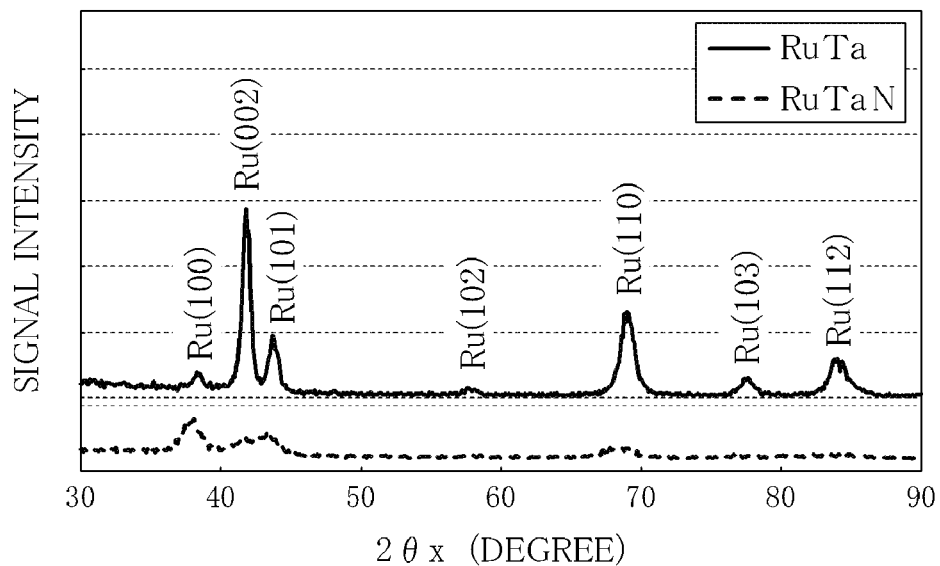
FIG. 2 is a view showing evaluation results of the crystallinity of a RuTa film and a RuTaN film.

FIG. 2 shows evaluation results of the crystallinity of the resultant RuTa film and RuTaN film, which specifically are measurement results of X-ray diffraction. It is found from FIG. 2 that the RuTaN film has low and broad peaks compared with the RuTa film, that is, the RuTaN film has an amorphous structure or a microcrystalline structure. This indicates that the RuTaN film is small in the number of grain boundaries and thus high in the effect of reducing diffusion of Cu, which diffuses through grain boundaries as paths, compared with the RuTa film.

Figure 3:
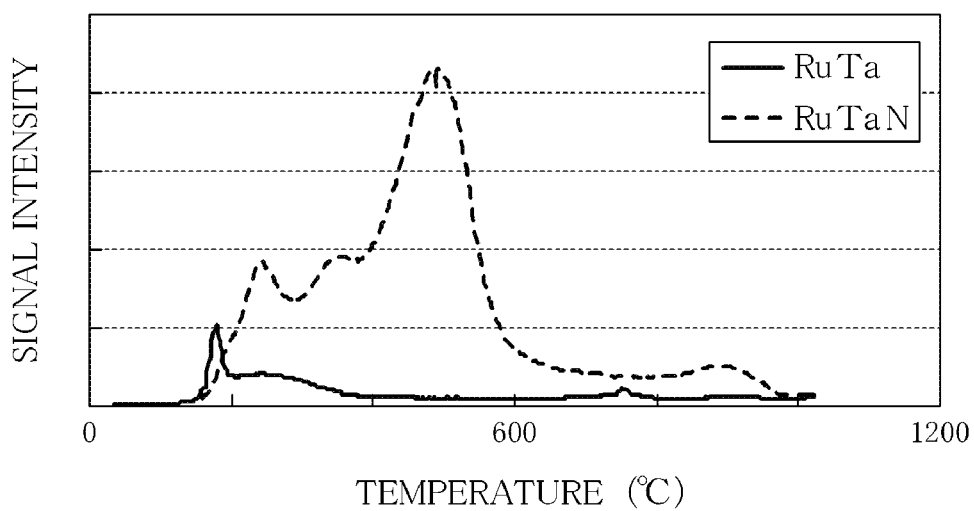
FIG. 3 is a view showing evaluation results of degassing of a RuTa film and a RuTaN film by TDS.

To evaluate the thermal stability of the RuTaN film, nitrogen ($N_2$) degassing was evaluated by thermal desorption spectroscopy (TDS). As a result, as shown in FIG. 3, it was found that N was desorbed by thermal treatment at 200 to 600° C. This indicates that, in the RuTaN film, nitrogen ($N_2$) will be desorbed, rendering crystal grains coarse, by thermal treatment involved in a process for formation of general interconnect structure (performed at about 400° C., for example), and as a result, the film will become low in barrier properties against Cu diffusion. As for the RuTa film, no large change is observed in a similar temperature range.

The reason for the above is considered that, in the RuTaN film having a Ta concentration of 10 wt. %, which is in the state of a solid solution of Ta in Ru, nitrogen exists in a nonequilibrium state without binding to Ru or Ta.

It is therefore desirable that the Ta concentration of the RuTa alloy used as a target in the sputtering is equal to or more than the solid solubility limit (20 wt. %) of Ta in Ru. Having such a Ta concentration, excessive Ta will be separated in the resultant RuTaN film, allowing the Ta and N to form thermally stable TaN. As a result, N won't be desorbed during heat treatment of the RuTaN film, and thus the barrier properties against Cu can be secured. Thus, the RuTaN film can exhibit both good wettability to Cu and barrier properties. The Ta concentration should preferably be 50 wt. % or less.

It may be considered that the Ta concentration of the RuTaN film formed by sputtering roughly corresponds with the Ta concentration of the RuTa alloy used as a target. Although some deviation may occur between the two Ta concentrations in some cases, it should be within the allowable range. Therefore, the inventors contemplate that, when the Ta concentration of the target exceeds the solid solubility limit, the Ta concentration of the resultant RuTaN film also practically exceeds the solid solubility limit.

The thickness of the first barrier metal film 103 should be in the range of 2 nm to 10 nm on the interlayer insulating film 101. Having such a thickness, the first barrier metal film 103 can be formed to cover the sidewalls and bottom of the trench 102 and secure sufficient barrier properties against copper diffusion. Although it is preferable for the first barrier metal film 103 to have a thickness within the above range, the thickness is not limited to this range. The first barrier metal film 103 may have a thickness outside the above range as far as sufficient barrier properties against Cu diffusion can be secured and the sidewalls and bottom of the trench 102 can be covered.

Subsequently, as shown in FIG. 1C, A Cu seed film 104 is deposited on the first barrier metal film 103 by sputtering.

As shown in FIG. 1D, a Cu film 105 (metal film) is then formed inside the trench 102 by electrolytic plating. Note that the Cu seed film 104 is not specifically shown in FIG. 1D as being regarded as an integral part of the Cu film 105.

As shown in FIG. 1E, excessive portions of the Cu film 105 and the first barrier metal film 103 protruding from the trench 102 are removed by chemical mechanical polishing (CMP). By this removal, the top surface of the interlayer insulating film 101 is exposed in the region other than the trench 102, and the Cu film is left inside the trench 102. Thus, an upper-layer interconnect 106 comprised of the first barrier metal film 103 and the Cu film 105 deposited in this order is formed inside the trench 102.

By repeating the steps of FIGS. 1A-1E described above as required, a semiconductor device having a multilayer interconnect structure can be manufactured. In such a semiconductor device, filling of a fine pattern with Cu is good, and also Cu diffusion to the interlayer insulating film, etc. is reduced.

In the thus-manufactured semiconductor device 100, having the first barrier metal film 103, the barrier properties against Cu diffusion is improved. Nitrogen gas, introduced during the formation of the first barrier metal film 103, is useful in imparting an amorphous structure to the first barrier metal film 103. In other words, with introduction of nitrogen gas, the first barrier metal film 103 has an amorphous structure whose atomic arrangement is irregular. This reduces the number of grain boundaries that serve as predominant diffusion paths of Cu, and thus improves the barrier properties against Cu diffusion.

Also, by setting the Ta concentration of RuTa as a target in sputtering to equal to or more than the solid solubility limit (20 wt. %) of Ta in Ru, the resultant RuTaN film becomes excellent in thermal stability. Therefore, during heat treatment in an interconnect process, no desorption of N in the film occurs, causing no change from the amorphous structure. Thus, the barrier properties against Cu diffusion can be maintained.

Although the first barrier metal film 103 was formed in one step in the above process, it may be formed over a plurality of steps. In this case, it is desirable to reduce the flow of nitrogen gradually step by step to finally reach zero. By introducing nitrogen in this way, the amount of nitrogen will decrease in the direction toward the center of the trench (toward the Cu film 105), and at the interface between the first barrier metal film 103 and the Cu seed film 104, the first barrier metal film 103 will be RuTa containing no nitrogen. As a result, since RuTa is better in wettability to Cu than RuTaN, the Cu filling characteristics will further improve.

As described above, by varying the amount of nitrogen in the single-layer first barrier metal film 103, it is possible to further improve the wettability to Cu while maintaining the barrier properties against Cu diffusion.

(Second Embodiment)

An example semiconductor device 100a, and a method for manufacturing the semiconductor device, of the second embodiment will be described hereinafter. FIGS. 4A-4F are cross-sectional views illustrating a step-by-step process for manufacturing the semiconductor device 100a.

The steps of FIGS. 4A and 4B are similar to the steps described above with reference to FIGS. 1A and 1B. By these steps, obtained is a structure having the first barrier metal film 103 covering the sidewalls and bottom of the trench 102 formed on the interlayer insulating film 101.

Subsequently, as shown in FIG. 4C, a second barrier metal film 107 is deposited on the first barrier metal film 103. As the second barrier metal film 107, a RuTa film is preferably formed by sputtering using a RuTa alloy target.

The conditions for the above film formation by sputtering are as follows: target power 10000 W, substrate bias power 500 W, DC-coil power 0 W, RF-coil power 2000 W, and Ar flow 15 sccm. The conditions in this case are different from the film formation conditions for the first barrier metal film 103 in that $N_2$ is not used.

Thereafter, steps of FIGS. 4D-4F are performed sequentially, to form an upper-layer interconnect 106a comprised of the first barrier metal film 103, the second barrier metal film 107, and the Cu film 105 deposited in this order inside the trench 102. These steps are similar to those described with reference to FIGS. 1C-1E in the first embodiment.

In the thus-manufactured semiconductor device 100a, as in the case of the first embodiment, the barrier properties against Cu diffusion are improved with the existence of the first barrier metal film 103. As in the first embodiment, the first barrier metal film 103 has an amorphous structure with introduction of nitrogen, thereby improving the barrier properties, and also is excellent in thermal stability by setting the Ta concentration to equal to or more than the solid solubility limit.

In addition, by forming the second barrier metal film 107 that is a RuTa film excellent in wettability to Cu on the first barrier metal film 103 that is a RuTaN film excellent in nitrogen barrier properties, the Cu filling characteristics are further improved.

Although the second barrier metal film 107 was formed by sputtering, the formation method is not limited to this. For example, atomic layer deposition (ALD) may be used. In this case, bis(ethylcyclopentadienyl)ruthenium (Ru(EtCp)$_2$), for example, may be used as a precursor, and argon (Ar), for example, as a carrier gas. Using such a method, also, it is possible to form the second barrier metal film 107 that is high in wettability to Cu and thus can improve the Cu filling characteristics.

Although a film made of pure Cu was used as the Cu seed film 104 in the first and second embodiments, the material is not limited to this. For example, a seed film of a Cu alloy such as Cu-Al may be used. Use of a Cu alloy seed film improves the wettability to the Ru-containing barrier film, compared with use of pure Cu. Thus, the Cu filling characteristics can be improved. Note that, using a Cu alloy seed film, the other component(s) (Al, etc.) constituting the Cu alloy will also diffuse to the Cu film 105 that occupies the trench to serve as the body of the interconnect. However, the amount of diffusion of such a component is small.

In the first and second embodiments, as the metals used for the first barrier metal film 103, ruthenium (Ru) was used as an element of the platinum group, and tantalum (Ta) as a refractory metal. However, the materials are not limited to these. For example, as the platinum-group element used for the first barrier metal film 103, rhodium (Rh), palladium (Pd), osmium (Os), iridium (Ir), or platinum (Pt) may be used, and as the refractory metal, titanium (Ti), tungsten (W), or vanadium (V) may be used. Otherwise, in each of the materials, two or more elements, out of the elements listed above, may be used.

The configuration described above can also be applied to a dual-damascene structure.

The semiconductor device and the method for manufacturing the same according to the present disclosure achieve high reliability. Therefore, the present disclosure is useful in semiconductor devices having interconnects formed by a damascene method, in particular, such as highly miniaturized and integrated LSIs.

What is claimed is:

1. A semiconductor device, comprising:
   a trench formed in an interlayer insulating film formed on a semiconductor substrate;
   a first barrier metal film formed to cover a bottom and sidewalls of the trench, the first barrier metal film being comprised of an electric conductor containing a platinum-group element, a refractory metal, and nitrogen; and
   a metal film formed on the first barrier metal film in the trench, wherein:
   an amount of nitrogen decreases in a thickness direction of the first barrier metal film toward the metal film, and
   the refractory metal is in a state of a solid solution in the platinum-group element.

2. The semiconductor device of claim 1, wherein
   the first barrier metal film is of a single-layer structure.

3. The semiconductor device of claim 1, further comprising:
   a second barrier metal film formed between the first barrier metal film and the metal film, the second barrier metal film being comprised of an electric conductor containing a platinum- group element and a refractory metal.

4. The semiconductor device of claim 1, wherein
   a concentration of the refractory metal contained in the first barrier metal film is equal to or more than a solid solubility limit of the refractory metal in the platinum-group element.

5. The semiconductor device of claim 1, wherein
   the platinum-group element is at least one selected from the group consisting of ruthenium (Ru), rhodium (Rh), palladium (Pd), osmium (Os), iridium (Ir), and platinum (Pt).

6. The semiconductor device of claim 1, wherein
   the refractory metal is at least one selected from the group consisting of tantalum (Ta), titanium (Ti), tungsten (W), and vanadium (V).

7. The semiconductor device of claim 1, wherein
   the first barrier metal film contains a nitride of the refractory metal.

8. The semiconductor device of claim 1, wherein the first barrier metal film has an amorphous structure.

9. The semiconductor device of claim 1, wherein the platinum-group element, the refractory metal, and the nitrogen of the first barrier metal form a single layer film.

10. A method for manufacturing a semiconductor device, the method comprising steps of:
    (a) forming a trench on an interlayer insulating film on a semiconductor substrate;
    (b) forming a first barrier metal film to cover a bottom and sidewalls of the trench, the first barrier metal film being comprised of an electric conductor containing a platinum-group element, a refractory metal, and nitrogen;
    (c) depositing copper or a copper alloy to cover the first barrier metal film;
    (d) filling the trench with a copper film after the step (c); and
    (e) removing portions of the first barrier metal film and the copper film protruding from the trench to form an interconnect after the step (d), wherein:
    in the step (b), the first barrier metal film is formed so that an amount of nitrogen decreases in a direction toward the center of the trench, and
    the refractory metal is in a state of a solid solution in the platinum-group element.

11. The method of claim 10, further comprising the step of:
    (f) forming a second barrier metal film to cover the first barrier metal film, the second barrier metal film being comprised of an electric conductor containing a platinum-group element and a refractory metal, after the step (b) and before the step (c),
    wherein
    in the step (c), copper or a copper alloy is deposited to cover the second barrier metal film, and
    in the step (e), a portion of the second barrier metal film protruding from the trench is also removed.

12. The method of claim 10, wherein
    in the step (b), the first barrier metal film is formed to have a single-layer structure.

13. The method of claim 10, wherein
    a concentration of the refractory metal contained in the first barrier metal film is equal to or more than a solid solubility limit of the refractory metal in the platinum-group element.

14. The method of claim 10, wherein
    the platinum-group element is at least one selected from the group consisting of ruthenium (Ru), rhodium (Rh), palladium (Pd), osmium (Os), iridium (Ir), and platinum (Pt).

15. The method of claim 10, wherein
    the refractory metal is at least one selected from the group consisting of tantalum (Ta), titanium (Ti), tungsten (W), and vanadium (V).

16. The method of claim 10, wherein in the step (b), the first barrier metal film has an amorphous structure.

17. The method of claim 10, wherein the platinum-group element, the refractory metal, and the nitrogen of the first barrier metal form a single layer film.

* * * * *